(12) United States Patent
Matsuo

(10) Patent No.: US 12,362,314 B2
(45) Date of Patent: Jul. 15, 2025

(54) BONDING APPARATUS AND BONDING METHOD

(71) Applicant: Tokyo Electron Limited, Tokyo (JP)

(72) Inventor: Yuhei Matsuo, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 244 days.

(21) Appl. No.: 18/318,836

(22) Filed: May 17, 2023

(65) Prior Publication Data

US 2023/0378121 A1 Nov. 23, 2023

(30) Foreign Application Priority Data

May 23, 2022 (JP) .................. 2022-083700

(51) Int. Cl.
*H01L 21/00* (2006.01)
*G06T 7/00* (2017.01)
(Continued)

(52) U.S. Cl.
CPC ............ *H01L 24/75* (2013.01); *G06T 7/0004* (2013.01); *G06T 7/73* (2017.01); *G06T 7/90* (2017.01); *H01L 24/83* (2013.01); *H01L 24/94* (2013.01); *H04N 23/10* (2023.01); *H04N 23/56* (2023.01); *H04N 23/90* (2023.01); *G06T 2207/10024* (2013.01); *G06T 2207/10152* (2013.01); *G06T 2207/30148* (2013.01); *G06T 2207/30204* (2013.01); *H01L 24/29* (2013.01); *H01L 24/32* (2013.01); *H01L 2224/29186* (2013.01); *H01L 2224/32145* (2013.01); *H01L 2224/7501* (2013.01); *H01L 2224/75701* (2013.01); *H01L 2224/75702* (2013.01); *H01L 2224/75744* (2013.01); *H01L 2224/75745* (2013.01); *H01L 2224/75753* (2013.01); *H01L 2224/7598* (2013.01); *H01L 2224/8301* (2013.01);
(Continued)

(58) Field of Classification Search
CPC ....................................................... H01L 21/00
See application file for complete search history.

(56) References Cited

U.S. PATENT DOCUMENTS

2018/0019225 A1* 1/2018 Matsunaga ............. H01L 24/75

FOREIGN PATENT DOCUMENTS

JP 2015-18926 A * 1/2015
JP 2020-194865 A 12/2020

* cited by examiner

*Primary Examiner* — Jeffry H Aftergut
(74) *Attorney, Agent, or Firm* — Chrisman Gallo Tochtrop LLC

(57) ABSTRACT

A bonding apparatus bonds a first substrate having a first alignment mark and a second substrate having a second alignment mark. A first radiation unit radiates white light to an imaging area of a first imaging unit when the second alignment mark is imaged by the first imaging unit. A second radiation unit radiates white light to an imaging area of a second imaging unit when the first alignment mark is imaged by the second imaging unit. A controller detects positions of the first alignment mark and the second alignment mark by processing images obtained by the first imaging unit and the second imaging unit, corrects the detected position of the first alignment mark based on a relationship between a wavelength and an intensity of reflection light reflected from the first substrate, and controls a moving unit based on the corrected position of the first alignment mark.

14 Claims, 13 Drawing Sheets

(51) Int. Cl.
     *G06T 7/73*           (2017.01)
     *G06T 7/90*           (2017.01)
     *H01L 23/00*          (2006.01)
     *H04N 23/10*          (2023.01)
     *H04N 23/56*          (2023.01)
     *H04N 23/90*          (2023.01)

(52) U.S. Cl.
     CPC ................ *H01L 2224/8313* (2013.01); *H01L 2224/8316* (2013.01); *H01L 2224/83896* (2013.01); *H01L 2224/94* (2013.01); *H01L 2924/0504* (2013.01); *H01L 2924/0544* (2013.01); *H01L 2924/059* (2013.01)

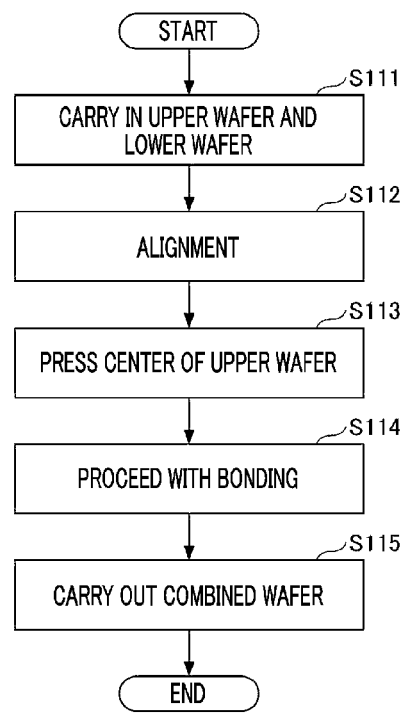

BONDING APPARATUS AND BONDING METHOD

CROSS-REFERENCE TO RELATED APPLICATION

This application claims the benefit of Japanese Patent Application No. 2022-083700 filed on May 23, 2022, the entire disclosure of which is incorporated herein by reference.

TECHNICAL FIELD

The various aspects and embodiments described herein pertain generally to a bonding apparatus and a bonding method.

BACKGROUND

A bonding apparatus described in Patent Document 1 bonds a first substrate having a first alignment mark and a second substrate having a second alignment mark. The bonding apparatus includes a first holder, a second holder, a first imaging unit, a first radiation unit, a second imaging unit, a second radiation unit, and a controller. The first holder holds the first substrate. The second holder holds the second substrate. When the first imaging unit images the second alignment mark, the first radiation unit radiates white light to an imaging area of the first imaging unit. When the second imaging unit images the first alignment mark, the second radiation unit radiates white light to an imaging area of the second imaging unit. The controller detects the positions of the first alignment mark and the second alignment mark by processing the images obtained by the first imaging unit and the second imaging unit, and performs alignment between the first substrate with the second substrate.

Patent Document 1: Japanese Patent Laid-open Publication No. 2020-194865

SUMMARY

In one exemplary embodiment, a bonding apparatus is configured to bond a first substrate having a first alignment mark and a second substrate having a second alignment mark. The bonding apparatus includes a first holder, a second holder, a first imaging unit, a first radiation unit, a second imaging unit, a second radiation unit, a moving unit and a controller. The first holder is configured to hold the first substrate. The second holder is configured to hold the second substrate. The first imaging unit is provided at the first holder, and is configured to image the second substrate held by the second holder. The first radiation unit is configured to radiate white light to an imaging area of the first imaging unit when the second alignment mark is imaged by the first imaging unit. The second imaging unit is provided at the second holder, and is configured to image the first substrate held by the first holder. The second radiation unit is configured to radiate white light to an imaging area of the second imaging unit when the first alignment mark is imaged by the second imaging unit. The moving unit is configured to move the first holder and the second holder relative to each other. The controller is configured to control the moving unit. The controller detects positions of the first alignment mark and the second alignment mark by processing images obtained by the first imaging unit and the second imaging unit, corrects the detected position of the first alignment mark based on a relationship between a wavelength and an intensity of reflection light reflected from the first substrate, and controls the moving unit based on the corrected position of the first alignment mark.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 5 is a flowchart illustrating an example of a process S105;

DETAILED DESCRIPTION

Figure 1:
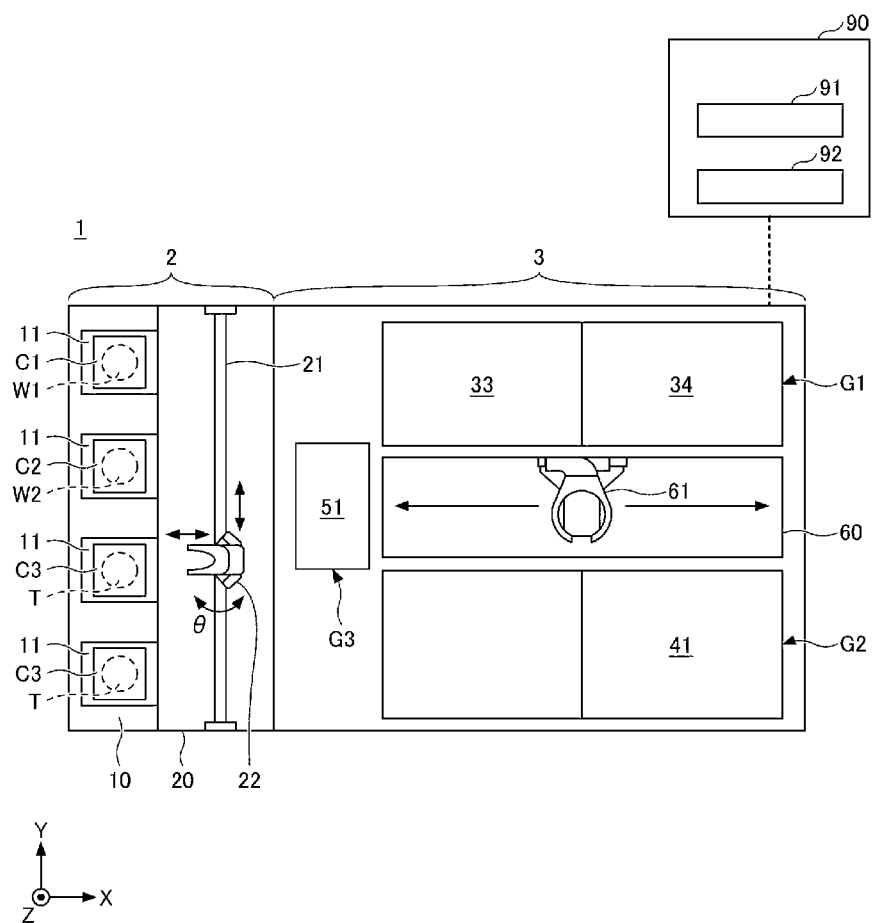
FIG. 1 is a plan view illustrating a bonding system according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments of the present disclosure will be described with reference to the accompanying drawings. In the various drawings, same or corresponding parts will be assigned same or corresponding reference numerals, and redundant description will be omitted. In the present specification, the X-axis direction, the Y-axis direction and the Z-axis direction are orthogonal to each other. The X-axis and Y-axis directions are horizontal directions, and the Z-axis direction is a vertical direction.

Figure 2:
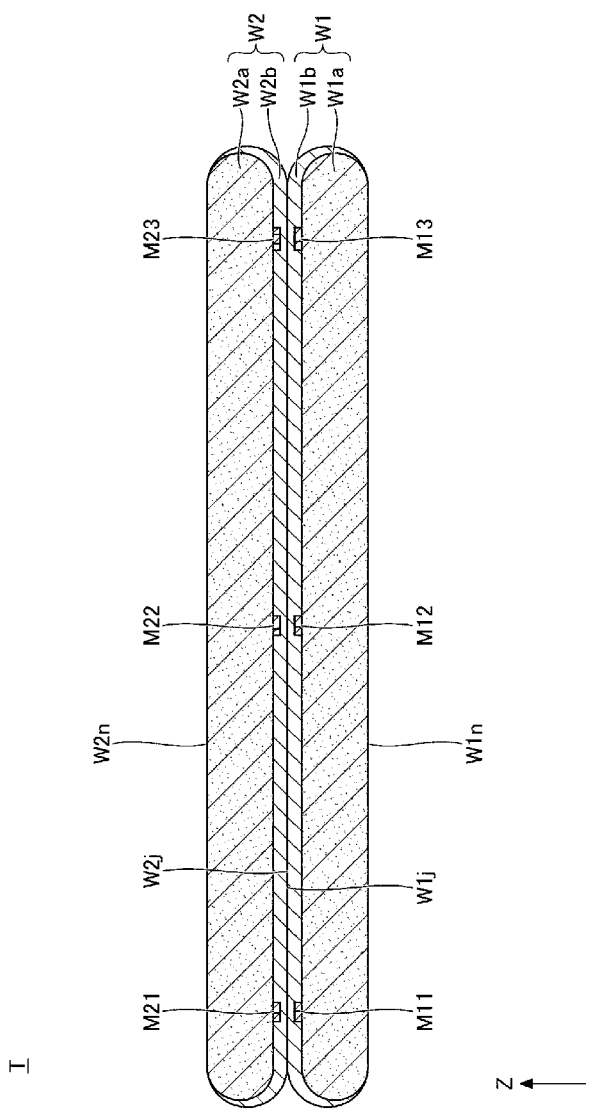
FIG. 2 is a cross sectional view illustrating an example of a combined wafer obtained by bonding a lower wafer and an upper wafer.

Referring to FIG. 1, a bonding system 1 according to an exemplary embodiment will be explained. The bonding system 1 produces a combined substrate by bonding a first substrate and a second substrate. As shown in FIG. 2, the substrate disposed on the lower side when the bonding is performed is referred to as a lower wafer W1, and the substrate disposed on the upper side when the bonding is performed is referred to as an upper wafer W2. Here, the lower wafer W1 corresponds to the first substrate, and the upper wafer W2 corresponds to the second substrate. However, the combination may be reversed, so the lower wafer W1 may correspond to the second substrate, and the upper wafer W2 may correspond to the first substrate.

A combined wafer T is obtained by bonding the lower wafer W1 and the upper wafer W2. Among plate surfaces of the lower wafer W1, the plate surface to be bonded to the upper wafer W2 will be referred to as "bonding surface W1j", and the plate surface opposite to the bonding surface W1j will be referred to as "non-bonding surface W1n". Further, among plate surfaces of the upper wafer W2, the plate surface to be bonded to the lower wafer W1 will be referred to as "bonding surface W2j", and the plate surface opposite to the bonding surface W2j will be referred to as "non-bonding surface W2n".

The lower wafer W1 has a semiconductor substrate W1a such as a silicon wafer, and a film W1b formed on the semiconductor substrate W1a. Instead of the semiconductor substrate W1a, a glass substrate may be used. The film W1b has, for example, a device layer and a bonding layer. The device layer includes a plurality of electronic circuits. The bonding layer is formed on the device layer. The bonding layer is, by way of non-limiting example, a silicon oxide film, a silicon nitride film, or a silicon carbonitride film.

The bonding layer is formed by a thermal oxidation method, a chemical vapor deposition (CVD) method, or an atomic layer deposition (ALD) method. When forming a silicon oxide film as the bonding layer by the CVD method, tetra ethoxy silane (TEOS), for example, is used as a source material for the silicon oxide film.

The lower wafer W1 has lower alignment marks M11 to M13. The lower alignment marks M11 to M13 are used for alignment of the lower wafer W1 and the upper wafer W2 in a horizontal direction before they are bonded. The lower alignment marks M11 to M13 are formed between the semiconductor substrate W1a and the film W1b, for example. The layout and the number of the lower alignment marks M11 to M13 are not limited to the shown example.

Likewise, the upper wafer W2 has a semiconductor substrate W2a such as a silicon wafer, and a film W2b formed on the semiconductor substrate W2a. Instead of the semiconductor substrate W2a, a glass substrate may be used. The film W2b has, for example, a device layer and a bonding layer. The device layer includes a plurality of electronic circuits. The bonding layer is formed on the device layer. The bonding layer is, for example, a silicon oxide film, a silicon nitride film, or a silicon carbonitride film.

The upper wafer W2 has upper alignment marks M21 to M23. The upper alignment marks M21 to M23 are used for the alignment of the lower wafer W1 and the upper wafer W2 in the horizontal direction before they are bonded. The upper alignment marks M21 to M23 are formed between the semiconductor substrate W2a and the film W2b, for example. The layout and the number of the upper alignment marks M21 to M23 are not limited to the shown example.

Here, the lower alignment marks M11 to M13 correspond to a first alignment mark, and the upper alignment marks M21 to M23 correspond to a second alignment mark. However, the combination may be reversed, so the lower alignment marks M11 to M13 may correspond to the second alignment mark, and the upper alignment marks M21 to M23 may correspond to the first alignment mark.

In addition, either one of the lower wafer W1 and the upper wafer W2 may not have the device layer.

As shown in FIG. 1, the bonding system 1 includes a carry-in/out station 2 and a processing station 3. The carry-in/out station 2 and the processing station 3 are arranged in the order of the carry-in/out station 2 and the processing station 3 along the positive X-axis direction. Further, the carry-in/out station 2 and the processing station 3 are connected as one body.

The carry-in/out station 2 includes a placing table 10 and a transfer section 20. The placing table 10 includes a plurality of placing plates 11. Cassettes C1, C2, and C3 each of which accommodates therein a plurality of (for example, 25 sheets of) substrates horizontally are respectively placed on the placing plates 11. The cassette C1 accommodates therein the lower wafer W1; the cassette C2, the upper wafer W2; and the cassette C3, the combined wafer T. Further, the lower wafer W1 and the upper wafer W2 are accommodated in the cassette C1 and the cassette C2 with their bonding surfaces W1j and W2j facing upwards, respectively.

The transfer section 20 is provided adjacent to the positive X-axis side of the placing table 10. Provided in this transfer section 20 are a transfer path 21 extending in the Y-axis direction and a transfer device 22 configured to be movable along this transfer path 21. The transfer device 22 has a transfer arm configured to hold and transfer the lower wafer W1, the upper wafer W2, or the combined wafer T. The transfer arm is configured to be movable in a horizontal direction and a vertical direction and pivotable around a vertical axis. The transfer arm may be plural in number. The transfer arm transfers the upper wafer W2, the lower wafer W1, or the combined wafer T to a preset device adjacent to the transfer section 20.

Further, the number of the cassettes C1 to C3 placed on the placing table 10 is not limited to the shown example. In addition to the cassettes C1, C2, and C3, a cassette for collecting a defective substrate, or the like may also be disposed on the placing table 10.

The processing station 3 is equipped with, for example, three processing blocks G1, G2 and G3. By way of example, the first processing block G1 is provided on the rear side (positive Y-axis side of FIG. 1) of the processing station 3, and the second processing block G2 is provided on the front side (negative Y-axis side of FIG. 1) of the processing station 3. Further, the third processing block G3 is provided on the carry-in/out station 2 side (negative X-axis side in FIG. 1) of the processing station 3.

A transfer section 60 is formed in a region surrounded by the first to third processing blocks G1 to G3. A transfer device 61 is disposed in the transfer section 60. The transfer device 61 has a transfer arm configured to hold and transfer the lower wafer W1, the upper wafer W2, or the combined wafer T. The transfer arm is configured to be movable in a horizontal direction and a vertical direction and pivotable around a vertical axis. The transfer arm may be plural in number. The transfer arm transfers the lower wafer W1, the upper wafer W2, or the combined wafer T to a preset device adjacent to the transfer section 60.

Disposed in the first processing block G1 are, for example, a surface modifying apparatus 33 and a surface hydrophilizing apparatus 34. The surface modifying apparatus 33 is configured to modify the bonding surface W1j of the lower wafer W1 or the bonding surface W2j of the upper wafer W2 with plasma. The surface hydrophilizing apparatus 34 is configured to hydrophilize the modified bonding surface W1j of the lower wafer W1 or the modified bonding surface W2j of the upper wafer W2. The positions of the surface modifying apparatus 33 and the surface hydrophilizing apparatus 34 are not limited to the shown example. The surface modifying apparatus 33 and the surface hydrophilizing apparatus 34 may be plural in number.

The surface modifying apparatus 33 forms, for example, a dangling bond of Si by cutting a $SiO_2$ bond in the bonding surfaces W1j and W2j, thus enabling hydrophilization afterwards. In the surface modifying apparatus 33, an oxygen gas as a processing gas is excited into plasma to be ionized in, for example, a decompressed atmosphere. As oxygen ions are radiated to the bonding surfaces W1j and W2j, the bonding surfaces W1j and W2j are modified by being plasma-processed. The processing gas is not limited to the oxygen gas, and a nitrogen gas or the like may be used, for example.

The surface hydrophilizing apparatus 34 applies an OH group to the bonding surfaces W1j and W2j, for example. The surface hydrophilizing apparatus 34 supplies pure water onto the lower wafer W1 or the upper wafer W2 while rotating the lower wafer W1 or the upper wafer W2 held by a spin chuck, for example. The pure water is diffused on the bonding surface W1j or W2j, and imparts the OH group to the dangling bond of Si, thus allowing the bonding surface W1j or W2j to be hydrophilized. The surface hydrophilizing apparatus 34 also has a function of cleaning the bonding surfaces W1j and W2j.

Disposed in the second processing block G2 is, for example, a bonding apparatus 41. The bonding apparatus 41 turns the upper wafer W2 upside down, thus allowing the bonding surface W2j of the upper wafer W2 to face down. Thereafter, the bonding apparatus 41 bonds the hydrophilized lower wafer W1 and the hydrophilized upper wafer W2 to produce the combined wafer T. Further, although a device configured to invert the upper wafer W2 upside down is provided as a part of the bonding apparatus 41 in the present exemplary embodiment, it may be provided separately from the bonding apparatus 41.

Disposed in the third processing block G3 is, for example, a transition device 51. The transition device 51 temporarily stores therein the lower wafer W1, the upper wafer W2, or the combined wafer T. The transition device 51 may be plural in number.

The bonding system 1 is equipped with a control device 90. The control device 90 is, for example, a computer, and includes a CPU (Central Processing Unit) 91 and a recording medium 92 such as a memory. The recording medium 92 stores therein a program for controlling various kinds of processings performed in the bonding system 1. The control device 90 controls an operation of the bonding system 1 by causing the CPU 91 to execute the program stored in the recording medium 92.

Figure 3:
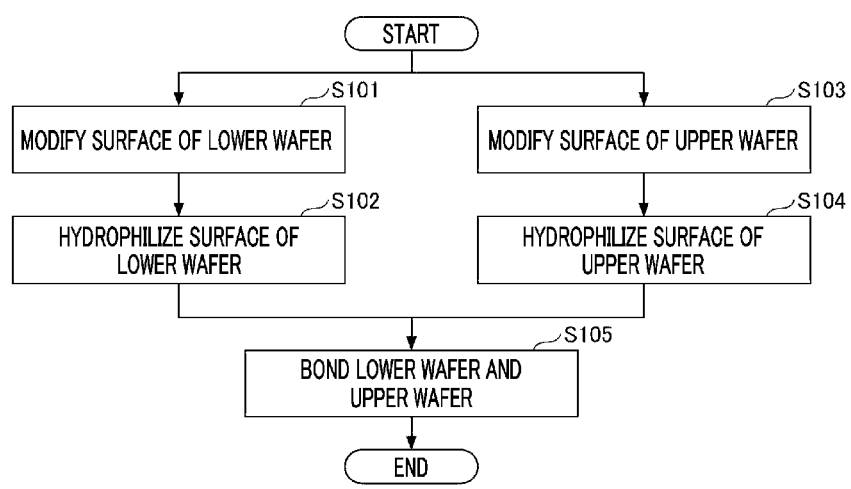
FIG. 3 is a flowchart illustrating a bonding method according to the exemplary embodiment.

Now, referring to FIG. 3, a bonding method according to the present exemplary embodiment will be described. The bonding method includes, for example, processes S101 to S105. The processes S101 to S105 are performed under the control of the control device 90. Further, the bonding method does not need to include all of the processes S101 to S105 as long as it has the process 105 at least. In addition, the bonding method may have a process other than the process S105.

First, the cassette C1 accommodating therein a plurality of lower wafers W1, the cassette C2 accommodating therein a plurality of upper wafers W2, and the empty cassette C3 are placed on the placing table 10 of the carry-in/out station 2.

Then, the transfer device 22 takes out the lower wafer W1 from the cassette C1, and transfers it to the transition device 51. Thereafter, the transfer device 61 takes out the lower wafer W1 from the transition device 51, and transfers it to the surface modifying apparatus 33.

Next, the surface modifying apparatus 33 modifies the bonding surface W1j of the lower wafer W1 (process S101). The modification of the bonding surface W1j is performed in the state that the bonding surface W1j faces upwards. Thereafter, the transfer device 61 takes out the lower wafer W1 from the surface modifying apparatus 33, and transfers it to the surface hydrophilizing apparatus 34.

Subsequently, the surface hydrophilizing apparatus 34 hydrophilizes the bonding surface W1j of the lower wafer W1 (process S102). The hydrophilization of the bonding surface W1j is performed in the state that the bonding surface W1j faces upwards. Thereafter, the transfer device 61 takes out the lower wafer W1 from the surface hydrophilizing apparatus 34, and transfers it to the bonding apparatus 41.

In parallel with the above-described processing for the lower wafer W1, the following processing for the upper wafer W2 is performed. First, the transfer device 22 takes out the upper wafer W2 from the cassette C2, and transfers it to the transition device 51. Then, the transfer device 61 takes out the upper wafer W2 from the transition device 51, and transfers it to the surface modifying apparatus 33.

Subsequently, the surface modifying apparatus 33 modifies the bonding surface W2j of the upper wafer W2 (process S103). The modification of the bonding surface W2j is performed in the state that the bonding surface W2j faces upwards. Thereafter, the transfer device 61 takes out the upper wafer W2 from the modifying apparatus 33, and transfers it to the surface hydrophilizing apparatus 34.

Next, the surface hydrophilizing apparatus 34 hydrophilizes the bonding surface W2j of the upper wafer W2 (process S104). The hydrophilization of the bonding surface W2j is performed in the state that the bonding surface W2j faces upwards. Then, the transfer device 61 takes out the upper wafer W2 from the surface hydrophilizing apparatus 34, and transfers it to the bonding apparatus 41.

Subsequently, the bonding apparatus 41 inverts the upper wafer W2 upside down, thus allowing the bonding surface W2j of the upper wafer W2 to face down. Thereafter, the bonding apparatus 41 bonds the lower wafer W1 and the upper wafer W2 to produce the combined wafer T (process S105). Then, the transfer device 61 takes out the combined wafer T from the bonding apparatus 41, and transfers it to the transition device 51.

Finally, the transfer device 22 takes out the combined wafer T from the transition device 51, and transfers it to the cassette C3 on the placing table 10. Thus, the series of processes are completed.

Figure 4:
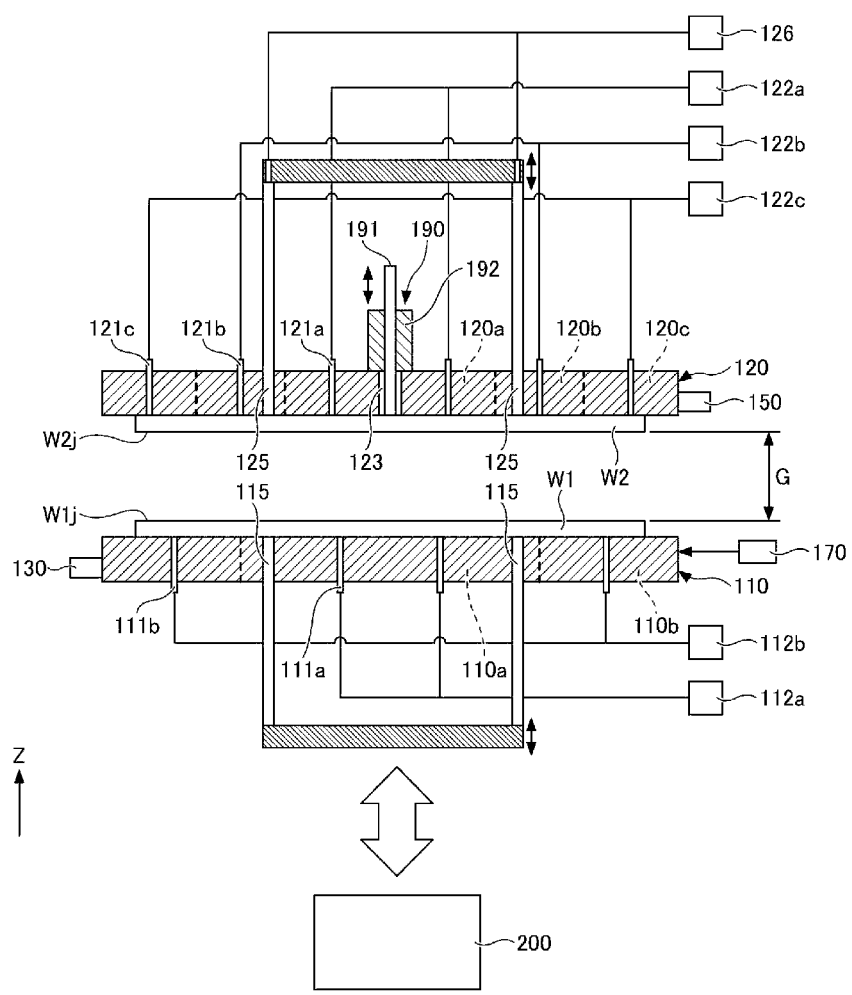
FIG. 4 is a cross sectional view illustrating an example of a bonding apparatus.

Now, referring to FIG. 4, an example of the bonding apparatus 41 will be discussed. The bonding apparatus 41 includes a lower holder 110, an upper holder 120, a lower imaging unit 130, an upper imaging unit 150, a moving unit 170, and a controller 200.

The lower holder 110 is configured to hold the lower wafer W1 from below with the bonding surface W1*j* of the lower wafer W1 facing upwards. The upper holder 120 is configured to hold the upper wafer W2 from above with the bonding surface W2*j* of the upper wafer W2 facing downwards. The lower holder 110 corresponds to a first holder, and the upper holder 120 corresponds to a second holder. However, the combination may be reversed.

The lower imaging unit 130 is provided at the lower holder 110 and configured to image the upper wafer W2 held by the upper holder 120. The upper imaging unit 150 is provided at the upper holder 120 and configured to image the lower wafer W1 held by the lower holder 110. The lower imaging unit 130 corresponds to a first imaging unit, and the upper imaging unit 150 corresponds to a second imaging unit. However, the combination may be reversed.

The moving unit 170 is configured to move the lower holder 110 and the upper holder 120 relative to each other in a horizontal direction and a vertical direction. Although the moving unit 170 is configured to move the lower holder 110 in the present exemplary embodiment, it may move the upper holder 120 instead. Further, the moving unit 170 may rotate the lower holder 110 or the upper holder 120 around a vertical axis.

The controller 200 controls the operation of the bonding apparatus 41. The controller 200 is, for example, a computer, and is configured in the same way as the control device 90. The controller 200 may be a part of the control device 90.

The lower holder 110 is divided into a plurality of (for example, two) regions 110*a* and 110*b*. These regions 110*a* and 110*b* are provided in this order from the center of the lower holder 110 toward the periphery thereof. The region 110*a* has a circular shape when viewed from the top, and the region 110*b* has an annular shape when viewed from the top.

Suction pipes 111*a* and 111*b* are independently provided in the regions 110*a* and 110*b*, respectively. Separate vacuum pumps 112*a* and 112*b* are connected to the suction pipes 111*a* and 111*b*, respectively. The lower holder 110 is capable of vacuum-attracting the lower wafer W1 in each of the regions 110*a* and 110*b* independently.

The lower holder 110 is provided with a plurality of holding pins 115 configured to be movable up and down in a vertical direction. The lower wafer W1 is placed on upper ends of the plurality of holding pins 115. Further, the lower wafer W1 may be vacuum-attracted to the upper ends of the plurality of holding pins 115.

The holding pins 115 are protruded from a holding surface of the lower holder 110 as they are raised. In this state, the holding pins 115 receive the lower wafer W1 from the transfer device 61. Then, the holding pins 115 are lowered, allowing the lower wafer W1 to come into contact with the holding surface of the lower holder 110. Subsequently, the lower holder 110 horizontally vacuum-attracts the lower wafer W1 in each of the regions 110*a* and 110*b* by the operation of the vacuum pumps 112*a* and 112*b*.

The upper holder 120 is partitioned into a plurality of (for example, three) regions 120*a*, 120*b*, and 120*c*. These regions 120*a*, 120*b* and 120*c* are provided in this order from the center of the upper holder 120 toward the periphery thereof. The region 120*a* has a circular shape when viewed from the top, and the regions 120*b* and 120*c* have an annular shape when viewed from the top.

Suction pipes 121*a*, 121*b* and 121*c* are independently provided in the regions 120*a*, 120*b* and 120*c*, respectively. Separate vacuum pumps 122*a*, 122*b* and 122*c* are connected to the suction pipes 121*a*, 121*b* and 121*c*, respectively. The upper holder 120 is capable of vacuum-attracting the upper wafer W2 in each of the regions 120*a*, 120*b* and 120*c* independently.

The upper holder 120 is provided with a plurality of holding pins 125 configured to be movable up and down in a vertical direction. These holding pins 125 are connected to a vacuum pump 126 to vacuum-attract the upper wafer W2 by the operation of the vacuum pump 126. The upper wafer W2 is vacuum-attracted to lower ends of the plurality of holding pins 125. Instead of the plurality of holding pins 125, a ring-shaped attraction pad may be used.

The plurality of holding pins 125 are protruded from a holding surface of the upper holder 120 when they are lowered. In this state, the plurality of holding pins 125 receive the upper wafer W2 from the transfer device 61 by vacuum-attracting the upper wafer W2. Thereafter, the holding pins 125 are raised, allowing the upper wafer W2 to come into contact with the holding surface of the upper holder 120. Subsequently, the upper holder 120 horizontally vacuum-attracts the upper wafer W2 in each of the regions 120*a*, 120*b* and 120*c* by the operation of the vacuum pumps 122*a*, 122*b*, and 122*c*, respectively.

In addition, a through hole 123 is formed through the center of the upper holder 120 in the vertical direction. A pushing unit 190 to be described later is inserted through the through hole 123. The pushing unit 190 presses the center of the upper wafer W2 spaced apart from the lower wafer W1, thus bringing the upper wafer W2 into contact with the lower wafer W1.

The pushing unit 190 has a push pin 191 and an outer cylinder 192 serving as an elevation guide for the push pin 191. The push pin 191 is inserted through the through hole 123 by, for example, a driving unit (not shown) having a motor therein, and is protruded from the holding surface of the upper holder 120, pressing the center of the upper wafer W2.

Now, referring to FIG. 5 to FIG. 7C, an example of the operation of the bonding apparatus 41 will be described. First, the transfer device 61 carries the lower wafer W1 and the upper wafer W2 into the bonding apparatus 41 (process S111). The lower holder 110 holds the lower wafer W1 from below with the bonding surface W1*j* of the lower wafer W1 facing upwards. The upper holder 120 holds the upper wafer W2 from above with the bonding surface W2*j* of the upper wafer W2 facing downwards.

Figure 6A:
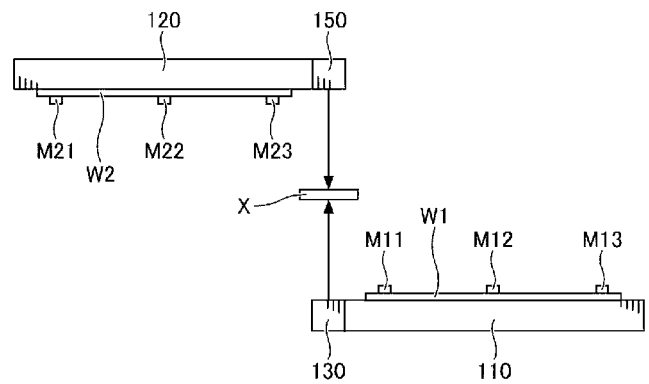
FIG. 6A is a side view illustrating an example of an operation in a process S112.
Figure 6B:
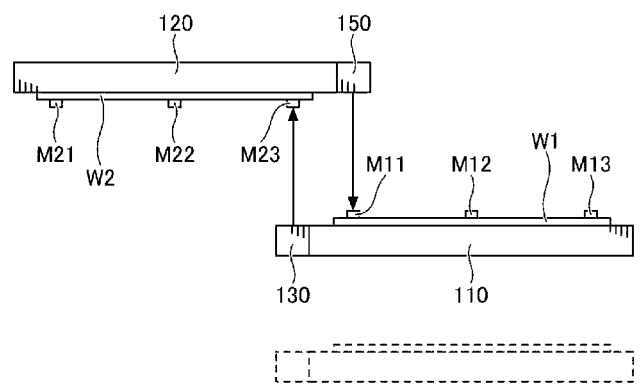
FIG. 6B is a side view illustrating an operation following that of FIG. 6A.
Figure 6C:
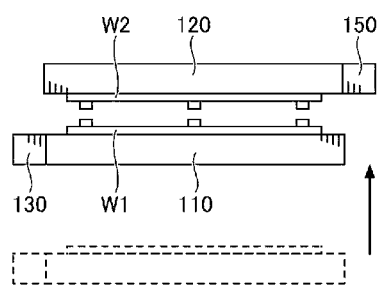
FIG. 6C is a side view illustrating an operation following that of FIG. 6B.

Then, the moving unit 170 moves the lower holder 110 and the upper holder 120 relative to each other, so that the position-alignment (alignment) of the lower wafer W1 and the upper wafer W2 is performed (process S112). For the alignment, the lower imaging unit 130 and the upper imaging unit 150 as shown in FIG. 6A to FIG. 6C are used. The upper imaging unit 150 is fixed to the upper holder 120, and it serves to image the bonding surface W1*j* of the lower wafer W1 held by the lower holder 110. Meanwhile, the lower imaging unit 130 is fixed to the lower holder 110, and it serves to image the bonding surface W2j of the upper wafer W2 held by the upper holder 120.

First, as shown in FIG. 6A, the moving unit 170 performs the alignment of the lower imaging unit 130 and the upper imaging unit 150 in the horizontal direction. Specifically, the moving unit 170 moves the lower holder 110 in the horizontal direction so that the lower imaging unit 130 is located substantially directly below the upper imaging unit 150. Then, the moving unit 170 finely adjusts the position of the lower imaging unit 130 in the horizontal direction so that the upper imaging unit 150 and the lower imaging unit 130 image a common target X and the positions of the upper imaging unit 150 and the lower imaging unit 130 in the horizontal direction are coincident. In this way, the alignment of the upper imaging unit 150 and the lower imaging unit 130 in the horizontal direction is completed.

Next, as shown in FIG. 6B, the moving unit 170 moves the lower holder 110 vertically upwards, and then performs alignment between the lower holder 110 and the upper holder 120 in the horizontal direction. Specifically, while the moving unit 170 moves the lower holder 110 in the horizontal direction, the upper imaging unit 150 images the lower alignment marks M11 to M13 sequentially, and the lower imaging unit 130 images the upper alignment marks M21 to M23 sequentially. FIG. 6B shows a state in which the upper imaging unit 150 is imaging the lower alignment mark M11 and the lower imaging unit 130 is imaging the upper alignment mark M23.

The lower imaging unit 130 and the upper imaging unit 150 transmit the obtained image data to the controller 200. The controller 200 detects the positions of the lower alignment marks M11 to M13 and the upper alignment marks M21 to M23 by processing the images obtained by the lower imaging unit 130 and the upper imaging unit 150. The controller 200 controls the moving unit 170 so that the lower alignment marks M11 to M13 and the upper alignment marks M21 to M23 are overlapped when viewed in the vertical direction.

Subsequently, as shown in FIG. 6C, the moving unit 170 moves the lower holder 110 vertically upward. As a result, a distance G (see FIG. 4) between the bonding surface W1j of the lower wafer W1 and the bonding surface W2j of the upper wafer W2 becomes a predetermined distance of, e.g., 80 μm to 200 μm.

Figure 7A:
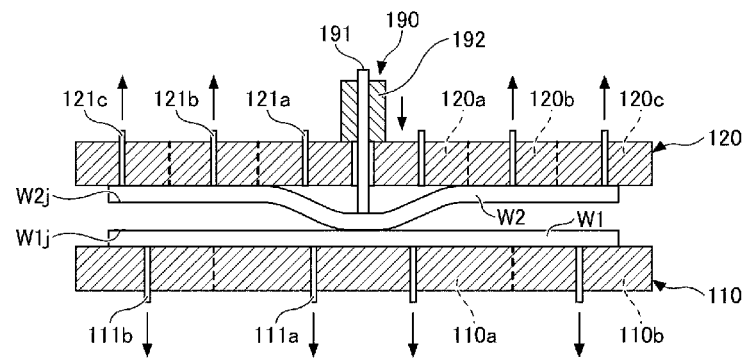
FIG. 7A is a cross sectional view illustrating an example of an operation in a process S113.

Thereafter, as shown in FIG. 7A, the operation of the vacuum pump 122a is stopped, so that the vacuum attraction of the upper wafer W2 in the region 120a is released. Then, the push pin 191 of the pushing unit 190 is lowered, pressing the center of the upper wafer W2 into contact with the lower wafer W1 (process S113). As a result, the centers of the lower wafer W1 and the upper wafer W2 are bonded to each other.

Since the bonding surface W1j of the lower wafer W1 and the bonding surface W2j of the upper wafer W2 are modified, a van der Waals force (intermolecular force) is generated between the bonding surfaces W1j and W2j, so that the bonding surfaces W1j and W2j are bonded to each other. In addition, since the bonding surfaces W1j and W2j are hydrophilized, hydrophilic groups (for example, the OH groups) are hydrogen-bonded, allowing the bonding surfaces W1j and W2j to be firmly bonded to each other.

Figure 7B:
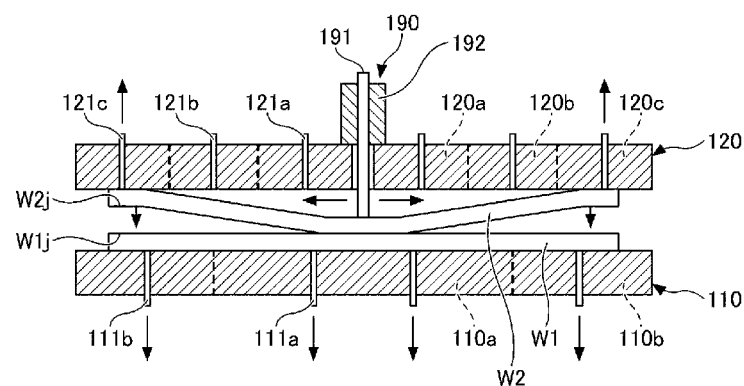
FIG. 7B is a cross sectional view illustrating an example of an operation in a process S114.
Figure 7C:
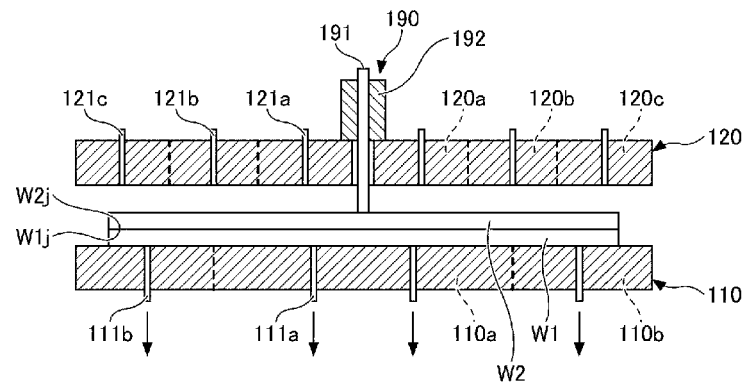
FIG. 7C is a cross sectional view illustrating an operation following that of FIG. 7B.

Next, as depicted in FIG. 7B, the operation of the vacuum pump 122b is stopped, so that the vacuum attraction of the upper wafer W2 in the region 120b is released. Subsequently, the operation of the vacuum pump 122c is stopped, so that the vacuum attraction of the upper wafer W2 in the region 120c is released, as shown in FIG. 7C.

As stated above, the vacuum attraction of the upper wafer W2 is released step by step from the center to the periphery of the upper wafer W2, so that the upper wafer W2 falls down into contact with the lower wafer W1 step by step. Then, the bonding of the lower wafer W1 and the upper wafer W2 progresses sequentially from the centers toward the peripheries thereof (process S114). As a result, the entire bonding surface W2j of the upper wafer W2 and the entire bonding surface W1j of the lower wafer W1 come into contact with each other, so that the lower wafer W1 and the upper wafer W2 are bonded, and the combined wafer T is obtained. Afterwards, the push pin 191 is raised up to its original position.

Subsequently, the moving unit 170 lowers the lower holder 110 to widen the distance between the lower holder 110 and the upper holder 120 in the vertical direction. Then, the transfer device 61 carries out the combined wafer T from the bonding apparatus 41 (process S115). Specifically, the lower holder 110 first releases the holding of the combined wafer T. Then, the plurality of holding pins 115 are raised to pass the combined wafer T to the transfer device 61. Thereafter, the plurality of holding pins 115 are lowered back to their original positions.

Figure 8:
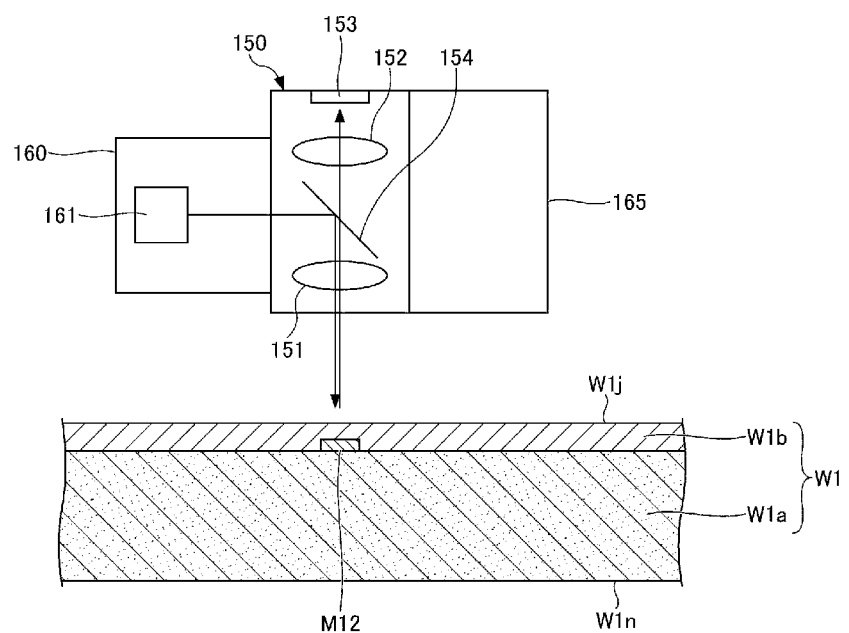
FIG. 8 is a cross sectional view illustrating an example of an upper imaging unit, an upper radiation unit, and an upper spectrometer.

Now, referring to FIG. 8 to FIG. 11, an example of detection of the position of the lower alignment mark M12 and correction of the detected position will be described. As shown in FIG. 8, the bonding apparatus 41 is equipped with, for example, the upper imaging unit 150, an upper radiation unit 160, and an upper spectrometer 165 in order to perform the detection of the position of the lower alignment mark M12 and the correction of the detected position.

The upper imaging unit 150 images the lower wafer W1. The upper imaging unit 150 includes, by way of example, an objective lens 151, an imaging lens 152, and light-receiving elements 153. Although not shown, the light-receiving elements 153 are arranged two-dimensionally. One light-receiving element 153 constitutes one pixel. The light-receiving element 153 receives reflection light from the lower wafer W1.

The upper imaging unit 150 may be either a black-and-white camera or a color camera. In the present exemplary embodiment, it is the black-and-white. When the upper imaging unit 150 is the black-and-white camera, each light-receiving element 153 does not receive light of a specific color (light of a specific wavelength) but receives light of various colors (light of various wavelengths), and generates an electrical signal according to received light intensity. The higher the received light intensity is, the higher the luminance of the pixel would be.

The upper imaging unit 150 may include a beam splitter 154 such as a half mirror between the objective lens 151 and the imaging lens 152. By way of example, the beam splitter 154 is configured to reflect the white light radiated by the upper radiation unit 160 toward the lower wafer W1, while transmitting the reflection light, which is generated as the white light is reflected by the lower wafer W1, toward the light-receiving element 153.

Here, the upper radiation unit 160 is fixed to the upper holder 120 in the same way as the upper imaging unit 150. However, it may not be fixed to the upper holder 120. The upper radiation unit 160 is configured to radiate the white light to an imaging area of the upper imaging unit 150 when the lower alignment mark M12 is imaged by the upper imaging unit 150. The white light is radiated to the imaging area of the upper imaging unit 150 via the beam splitter 154.

Further, the beam splitter 154 may be omitted, and the white light may be directly radiated to the imaging area of the upper imaging unit 150.

The upper radiation unit 160 has a light source 161 for the white light. The light source 161 is, for example, a white LED. The light radiation method of the white LED is not particularly limited. The white LED may include a blue LED and a yellow fluorescent body, or may include a red LED, a green LED, and a blue LED. Still alternatively, the whit LED may include a near-ultraviolet LED, a red fluorescent body, a green fluorescent body, and a blue fluorescent body.

Figure 9:
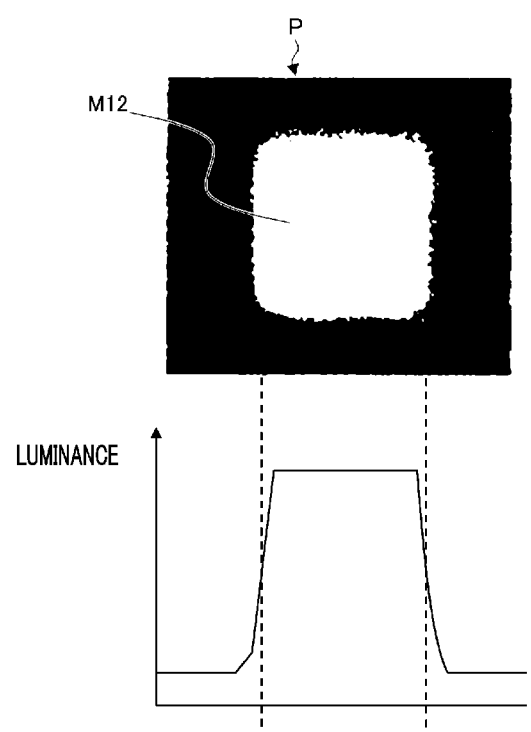
FIG. 9 is a diagram illustrating an example of an image obtained by imaging a lower alignment mark.

As shown in FIG. 9, the upper imaging unit 150 captures an image P including the lower alignment mark M12 and the vicinity thereof. The upper imaging unit 150 transmits the image P to the controller 200. The controller 200 has a position detection unit 201 (see FIG. 11). The position detection unit 201 is configured to detect the position of the lower alignment mark M12 by processing the image P. As the position of the lower alignment mark M12, the position detection unit 201 detects, for example, a position on the image P at which a change in luminance is maximized.

A difference (contrast) in luminance between the lower alignment mark M12 and the vicinity thereof in the image P is mainly determined by a difference in reflectance between the lower alignment mark M12 and the vicinity thereof. The larger the difference in reflectance is, the larger the difference in luminance may be. The difference in reflectance is mainly determined by the film thickness and the material of the film W1b of the lower wafer W1 and the thickness and the material of the lower alignment mark M12.

Figure 10:
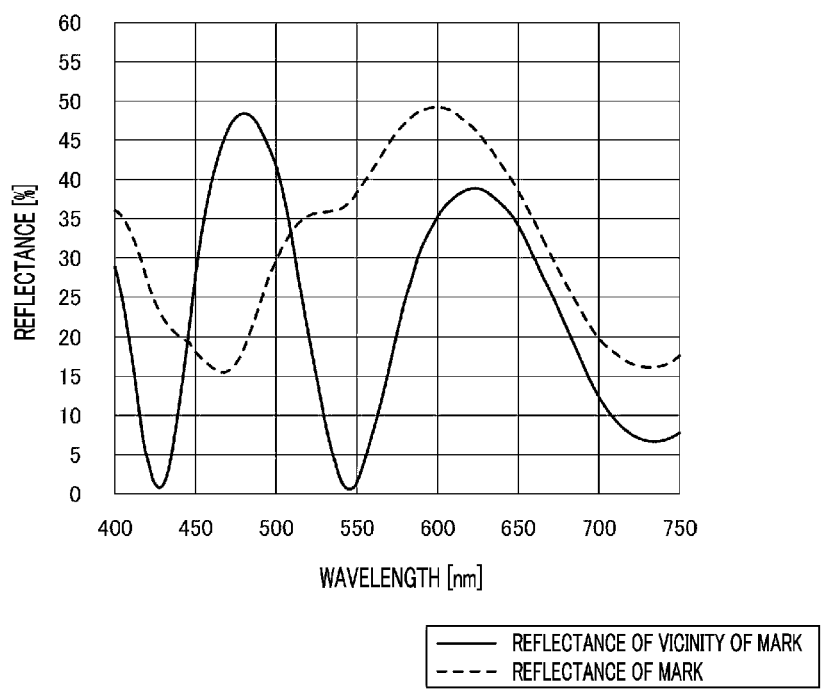
FIG. 10 is a diagram illustrating an example of a reflection spectrum.
Figure 11:
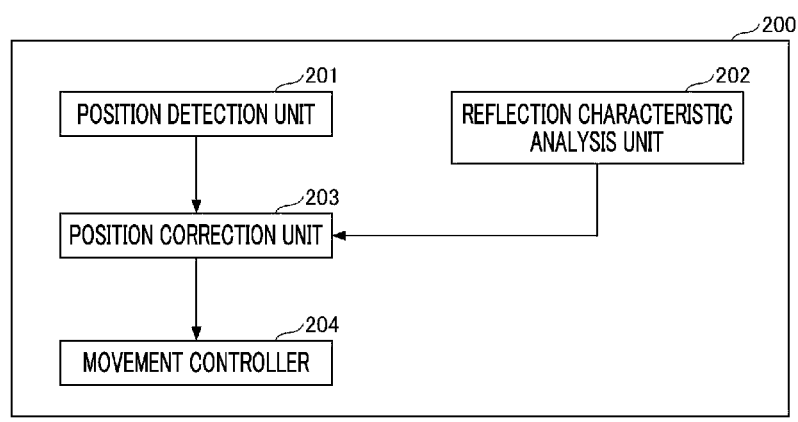
FIG. 11 is a functional block diagram illustrating an example of components of a controller.

FIG. 10 shows an example of reflection spectrum of the lower alignment mark M12 and the vicinity thereof. A stacking structure of the lower wafer W1 is different between the lower alignment mark M12 and its vicinity, so their reflection spectrum are different. The difference in reflectance between the lower alignment mark M12 and its vicinity increases or decreases depending on the wavelength of the light.

Therefore, when the upper imaging unit 150 images the lower alignment mark M12, the upper radiation unit 160 does not radiate light (for example, red light) of a specific wavelength but radiates the white light including light of various wavelengths to the imaging area of the upper imaging unit 150. Accordingly, even if the thickness or the material of the film W1b is changed, the difference in reflectance between the lower alignment mark M12 and the vicinity thereof can be stably secured, so that the difference in luminance in the image P can be stably secured.

The light-receiving element 153 of the upper imaging unit 150 receives the light of the various wavelengths. At this time, the light of the various wavelengths passes through the objective lens 151, the imaging lens 152, and so forth. Therefore, chromatic aberration occurs. The chromatic aberration leads to a deviation of the detected position of the lower alignment mark M12. If the deviation amount (magnitude and direction) of the detected position is constant, there may be caused no problem. If, however, the thickness or the material of the film W1b is changed, the reflection spectrum is changed, which may change the effect of the chromatic aberration and the deviation amount of the detected position.

Therefore, the upper spectrometer 165 is configured to detect a reflection spectrum of the reflection light reflected from the lower wafer W1. Although the upper spectrometer 165 is fixed to the upper holder 120 in the same way as the upper imaging unit 150, it may not be fixed to the upper holder 120. The upper spectrometer 165 has, for example, a light source (not shown) for white light, the same as the upper radiation unit 160. The upper spectrometer 165 radiates the white light emitted from the light source to the lower wafer W1, and detects the reflection spectrum of the reflection light reflected from the lower wafer W1.

The upper spectrometer 165 mainly detects the reflection spectrum of the reflection light reflected around the lower alignment mark M12. This is because a size of a measurement area of the upper spectrometer 165 is larger than the size of the lower alignment mark M12, and it is difficult to acquire the reflection spectrum of the reflection light reflected only from the lower alignment mark.

The upper spectrometer 165 transmits the detection result to the controller 200. The controller 200 has a reflection characteristic analysis unit 202 (see FIG. 11). The reflection characteristic analysis unit 202 is configured to calculate a relationship between a wavelength and an intensity of the reflection light. The relationship to be obtained includes, for example, an intensity ratio of first color light and second color light having different colors. The first color light is, for example, red light, and the second color light is, for example, blue light. The relationship to be obtained may include an intensity ratio of the first color light, the second color light and third color light having different colors. The third color light is, for example, green light. A variation in these intensity ratios represent a variation in the influence of the chromatic aberration, and represents a variation in the deviation amount of the detection position.

The controller 200 has a position correction unit 203. The position correction unit 203 is configured to correct the position detected by the position detection unit 201 based on the relationship obtained by the reflection characteristic analysis unit 202 (such as the intensity ratio of the first color light and the second color light). Accordingly, even if the effect of the chromatic aberration is changed due to the change in the thickness or the material of the film W1b, the exact position of the lower alignment mark M12 can be obtained. A relationship between the intensity ratio of the first color light and the second color light, etc., and a correction amount (magnitude and direction) of the detected position is obtained in advance through a test or the like, and is stored in the recording medium of the controller 200.

The controller 200 has a movement controller 204. The movement controller 204 is configured to control the moving unit 170 based on the position of the lower alignment mark M12 corrected by the position correction unit 203. The movement controller 204 controls the moving unit 170 so that the lower alignment mark M12 and the upper alignment mark M22 are overlapped when viewed from the vertical direction. Accordingly, alignment precision before the bonding can be improved.

Although not shown, in order to perform the detection of the position of the upper alignment mark M22 and the correction of the detected position, the bonding apparatus 41 may be equipped with, by way of example, the lower imaging unit 130, a lower radiation unit, and a lower spectrometer. The lower radiation unit is configured to radiate white light to an imaging area of the lower imaging unit 130 when the lower imaging unit 130 images the upper alignment mark M22. Although the lower radiation unit is fixed to the lower holder 110 in the same way as the lower imaging unit 130, it may not be fixed to the lower holder 110. The lower spectrometer is configured to detect a reflection spectrum of reflection light reflected from the upper wafer W2, and transmits the detected result to the controller 200. Although the lower spectrometer is fixed to the lower holder 110 in the same way as the lower imaging unit 130, it may not be fixed to the lower holder 110.

The reflection characteristic analysis unit 202 calculates a relationship between a wavelength and an intensity of the reflection light reflected from the upper wafer W2. The position correction unit 203 corrects the position of the upper alignment mark M22 detected by the position detection unit 201 based on the relationship (the intensity ratio between the first color light and the second color light, etc.) obtained by the reflection characteristic analysis unit 202. The movement controller 204 controls the moving unit 170 based on the position of the upper alignment mark M22 corrected by the position correction unit 203.

Figure 12:
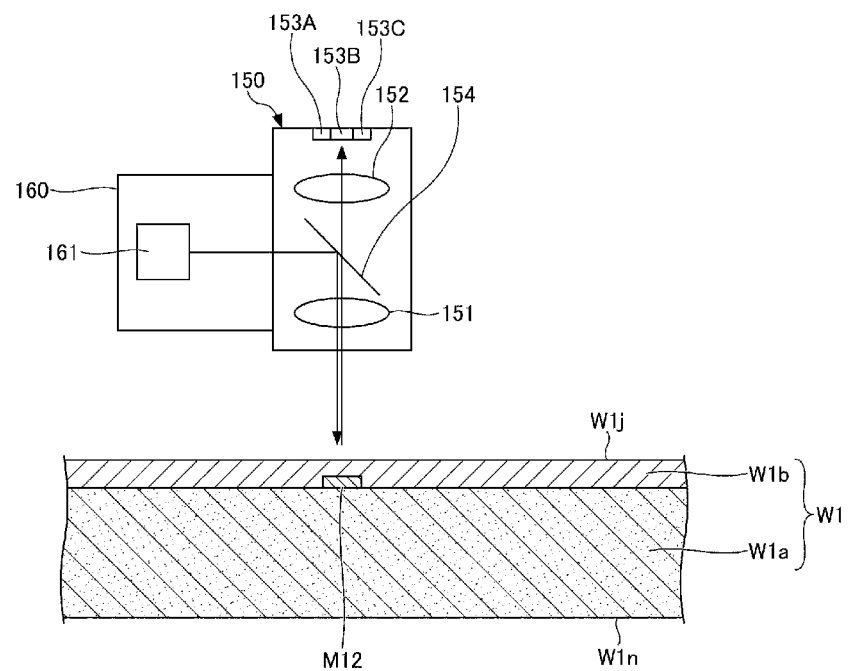
FIG. 12 is a cross sectional view illustrating a first modification example of the upper imaging unit and the upper radiation unit.

Now, referring to FIG. 12, a first modification example of the upper imaging unit 150 and the upper radiation unit 160 will be described. Below, the description will mainly focus on distinctive features. As illustrated in FIG. 12, the bonding apparatus 41 includes the upper imaging unit 150 and the upper radiation unit 160 without having the upper spectrometer 165 shown in FIG. 8. The reflection characteristic analysis unit 202 calculates the relationship between the wavelength and the intensity of the reflection light reflected from the lower wafer W1 by using the upper imaging unit 150 instead of the upper spectrometer 165.

The upper imaging unit 150 is a color camera. The color camera includes a first color light-receiving element 153A, a second color light-receiving element 153B, and a third color light-receiving element 153C. The first color light-receiving element 153A, the second color light-receiving element 153B, and the third color light-receiving element 153C receive light transmitted through different color filters to receive light of different colors. A single pixel is composed of the first color light-receiving element 153A, the second color light-receiving element 153B, and the third color light-receiving element 153C. Although not shown, a plurality of pixels are arranged two-dimensionally.

The reflection characteristic analysis unit 202 calculates a ratio of received light intensities of the first color light-receiving element 153A and the second color light-receiving element 153B constituting the same pixel. The first color is, for example, red, and the second color is, for example, blue. The reflection characteristic analysis unit 202 may calculate received light intensities of the first color light-receiving element 153A, the second color light-receiving element 153B, and the third color light-receiving element 153C constituting the same pixel. The third color is, for example, green light. The ratio of these received light intensities shows a relationship between the wavelength and the intensity of the reflection light.

The size of the imaging area of one pixel is sufficiently smaller than the size of the lower alignment mark M12. Therefore, it is possible to calculate the ratio of the received light intensities from the lower alignment mark M12 and the vicinity of the lower alignment mark M12 separately.

The pixel for which the ratio of the received light intensities is calculated may be either a pixel for imaging the vicinity of the lower alignment mark M12 or a pixel for imaging the lower alignment mark M12, or both of them. A plurality of pixels may be used to calculate any one ratio of the received light intensities. That is, the ratio of the received light intensities may be an average value.

The contents of this modification example may also be applicable to the lower imaging unit 130 and the lower radiation unit 140. That is, when the lower imaging unit 130 is a color camera, the reflection characteristic analysis unit 202 is capable of calculating the relationship between the wavelength and the intensity of the reflection light reflected from the upper wafer W2 by using the lower imaging unit 130 instead of the lower spectrometer.

Figure 13:
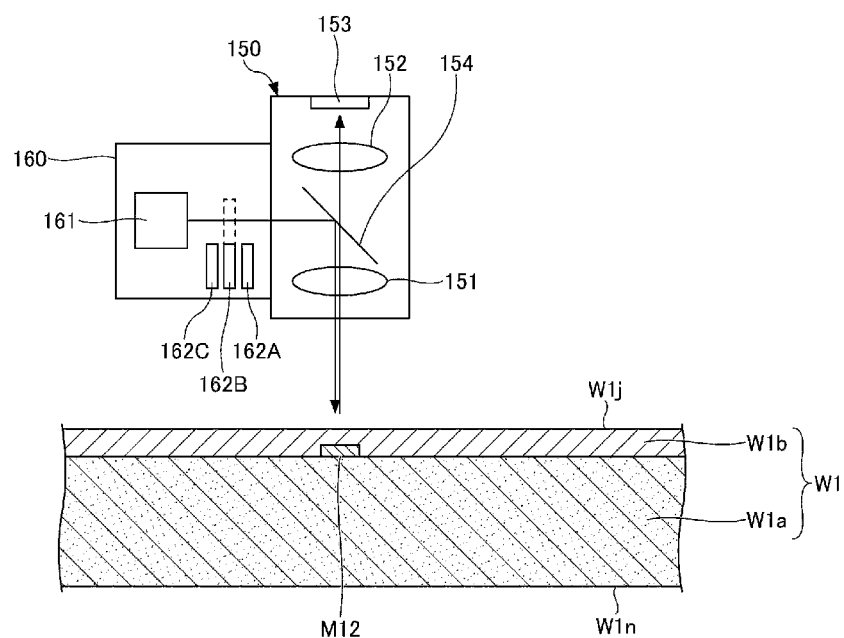
FIG. 13 is a cross sectional view illustrating a second modification example of the upper imaging unit and the upper radiation unit.

Now, referring to FIG. 13, a second modification example of the upper imaging unit 150 and the upper radiation unit 160 will be described. Below, the description will mainly focus on distinctive features. Even if the upper imaging unit 150 is a black-and-white camera, the upper spectrometer 165 may not be required as long as the upper radiation unit 160 is capable of radiating the white light, the first color light, and the second color light having different colors to the imaging area of the upper imaging unit 150 while switching them. The reflection characteristic analysis unit 202 calculates the relationship between the wavelength and the intensity of the reflection light reflected from the lower wafer W1 by using the upper imaging unit 150 instead of the upper spectrometer 165.

The upper radiation unit 160 includes, by way of example, the light source 161 for the white light, a first color filter 162A, and a second color filter 162B. The first color filter 162A is configured to selectively transmit first color light among the white light. The second color filter 162B is configured to selectively transmit second color light among the white light. The first color light is, for example, red light, and the second color light is, for example, blue light.

Each of the first color filter 162A and the second color filter 162B is moved between a position on an optical path of the white light and a position outside the optical path of the white light. Accordingly, the upper radiation unit 160 is capable of radiating the white light, the first color light, and the second color light having different colors to the imaging area of the upper imaging unit 150 while switching them.

The upper radiation unit 160 may further include a third color filter 162C. The third color filter 162C is configured to selectively transmit third color light among the white light. The third color light is, for example, green light. The third color filter 162C is moved between a position on an optical path of the white light and a position outside the optical path of the white light. Accordingly, the upper radiation unit 160 is capable of radiating the white light, the first color light, the second color light, and the third color light having different colors to the imaging area of the upper imaging unit 150 while switching them.

The reflection characteristic analysis unit 202 calculates a ratio of received light intensities of the same light-receiving element 153 when the first color light and the second color light are radiated while being switched in the state that the imaging area of the upper imaging unit 150 is fixed. The first color is, for example, red, and the second color is, for example, blue. The reflection characteristic analysis unit 202 may calculate a ratio of received light intensities of the same light-receiving element 153 when the first color light, the second color light, and the third color light are radiated while being switched in the state that the imaging area of the upper imaging unit 150 is fixed. The third color is, for example, green light. The ratio of these received light intensities shows the relationship between the wavelength and the intensity of the reflection light.

The size of the imaging area of one pixel is sufficiently smaller than the size of the lower alignment mark M12. Therefore, it is possible to calculate the ratio of the received light intensities from the lower alignment mark M12 and the vicinity of the lower alignment mark M12 separately.

The pixel for which the ratio of the received light intensities is obtained may be either a pixel for imaging the vicinity of the lower alignment mark M12 or a pixel for imaging the lower alignment mark M12, or both of them. A plurality of pixels may be used to obtain the ratio of any one received light intensity. That is, the ratio of the received light intensities may be an average value.

The contents of the present modification example are also applicable to the lower imaging unit 130 and the lower radiation unit. Even when the lower imaging unit 130 is a black-and-white camera, the lower spectrometer may not be required as long as the lower radiation unit is capable of radiating the white light, the first color light, and the second color light having different colors to the imaging area of the lower imaging unit 130 while switching them. The lower radiation unit may have a light source for the white light, a first color filter, and a second color filter. The lower radiation unit may further have a third color filter.

Figure 14:
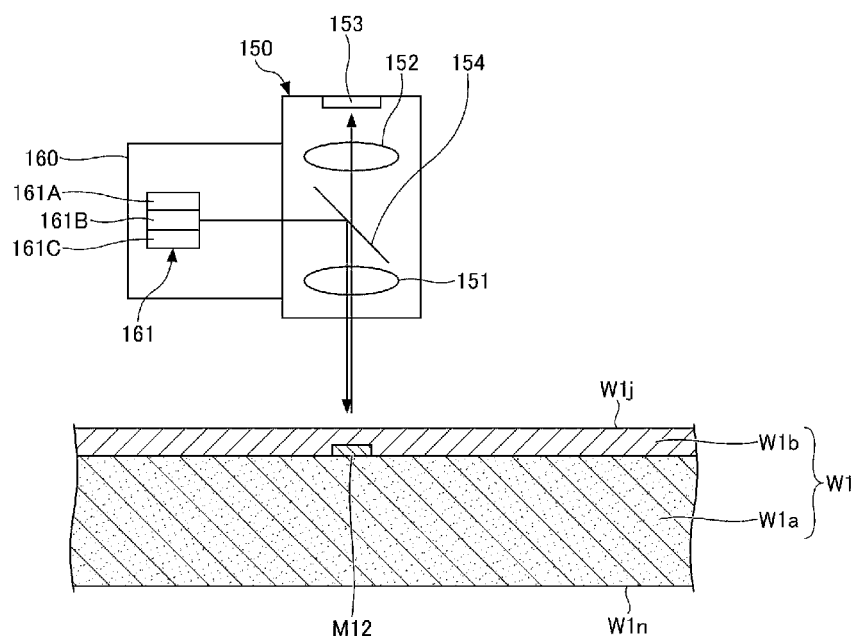
FIG. 14 is a cross sectional view illustrating a third modification example of the upper imaging unit and the upper radiation unit.

Now, referring to FIG. 14, a third modification example of the upper imaging unit 150 and the upper radiation unit 160 will be described. Below, the description will mainly focus on distinctive features. The light source 161 for the white light includes a light source 161A for first color light, a light source 161B for second color light, and a light source 161C for third color light to radiate the white light, the first color light, the second color light and the third color light having different colors to the imaging area of the upper imaging unit 15 while switching them.

By way of non-limiting example, the first color light is red light; the second color light, blue light; and the third color light, green light. The upper radiation unit 160 is capable of radiating the white light by simultaneously turning on the three light sources 161A, 161B, and 161C. In addition, the upper radiation unit 160 is also capable of radiating only one of the first color light, the second color light, and the third color light by turning on only one of the three light sources 161A, 161B, and 161C.

Although the light source 161 for the white light includes the light source 161A for the first color light, the light source 161B for the second color light, and the light source 161C for the third color light, the present disclosure is not limited thereto. The upper radiation unit 160 may have the light source 161 for the white light, the light source 161A for the first color light, the light source 161B for the second color light, and the light source 161C for the third color light separately.

The contents of the present modification example are also applicable to the lower imaging unit 130 and the lower radiation unit. That is, the lower radiation unit may have a light source for the white light, and the light source for the white light may have a light source for the first color light, a light source for the second color light, and a light source for the third color light. Furthermore, the lower radiation unit may have the light source for the white light, the light source for the first color light, the light source for the second color light, and the light source for the third color light separately.

So far, the exemplary embodiment of the bonding apparatus and the bonding method according to the present disclosure have been described. However, the present disclosure is not limited to the above-described exemplary embodiment and the like. Various changes, modifications, substitutions, additions, deletions and combinations may be made within the scope of the claims, which are all incorporated within a technical scope of the present disclosure.

According to the exemplary embodiment, it is possible to improve the alignment precision before the bonding.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

I claim:

1. A bonding apparatus configured to bond a first substrate having a first alignment mark and a second substrate having a second alignment mark, the bonding apparatus comprising:
a first holder configured to hold the first substrate;
a second holder configured to hold the second substrate;
a first imaging unit provided at the first holder, and configured to image the second substrate held by the second holder;
a first radiation unit configured to radiate white light to an imaging area of the first imaging unit when the second alignment mark is imaged by the first imaging unit;
a second imaging unit provided at the second holder, and configured to image the first substrate held by the first holder;
a second radiation unit configured to radiate white light to an imaging area of the second imaging unit when the first alignment mark is imaged by the second imaging unit;
a moving unit configured to move the first holder and the second holder relative to each other; and
a controller configured to control the moving unit,
wherein the controller detects positions of the first alignment mark and the second alignment mark by processing images obtained by the first imaging unit and the second imaging unit, corrects the detected position of the first alignment mark based on a relationship between a wavelength and an intensity of reflection light reflected from the first substrate, and controls the moving unit based on the corrected position of the first alignment mark.

2. The bonding apparatus of claim 1,
wherein the controller corrects the detected position of the second alignment mark based on a relationship between a wavelength and an intensity of reflection light reflected from the second substrate, and controls the moving unit based on the corrected position of the second alignment mark.

3. The bonding apparatus of claim 1, further comprising:
a spectrometer configured to detect a reflection spectrum of the reflection light reflected from the first substrate,
wherein the controller corrects the position of the first alignment mark based on a detection result of the spectrometer.

4. The bonding apparatus of claim 1,
wherein the second imaging unit has a color camera, and the color camera includes a first color light-receiving element and a second color light-receiving element configured to receive light of different colors, and
the controller corrects the position of the first alignment mark based on a ratio of received light intensities of the first color light-receiving element and the second color light-receiving element constituting a single pixel.

5. The bonding apparatus of claim 1,
wherein the second radiation unit radiates the white light, first color light, and second color light having different colors to the imaging area of the second imaging unit, the second imaging unit has a black-and-white camera, and the black-and-white camera includes a light-receiving element, and the controller corrects the position of the first alignment mark based on a ratio of received light intensities of the same light-receiving element when the first color light and the second color light are radiated while being switched in a state that the imaging area of the second imaging unit is fixed.

6. The bonding apparatus of claim 5, wherein the second radiation unit has a first color filter configured to selectively transmit the first color light among the white light, and a second color filter configured to selectively transmit the second color light among the white light.

7. The bonding apparatus of claim 5, wherein the second radiation unit has a light source for the white light, and the light source for the white light has a light source for the first color light and a light source for the second color light, or the second radiation unit has a light source for the white light, a light source for the first color light, and a light source for the second color light, separately.

8. A bonding method of bonding a first substrate having a first alignment mark and a second substrate having a second alignment mark, the bonding method comprising:

holding the first substrate by a first holder;

holding the second substrate by a second holder;

imaging, with a first imaging unit provided at the first holder, the second substrate held by the second holder;

radiating white light to an imaging area of the first imaging unit from a first radiation unit when the second alignment mark is imaged by the first imaging unit;

imaging, with a second imaging unit provided at the second holder, the first substrate held by the first holder;

radiating white light to an imaging area of the second imaging unit from a second radiation unit when the first alignment mark is imaged by the second imaging unit;

detecting positions of the first alignment mark and the second alignment mark by processing images obtained by the first imaging unit and the second imaging unit;

correcting the detected position of the first alignment mark based on a relationship between a wavelength and an intensity of reflection light reflected from the first substrate; and moving the first holder and the second holder relative to each other based on the corrected position of the first alignment mark.

9. The bonding method of claim 8, further comprising:

correcting the detected position of the second alignment mark based on a relationship between a wavelength and an intensity of reflection light reflected from the second substrate; and moving the first holder and the second holder relative to each other based on the corrected position of the second alignment mark.

10. The bonding method of claim 8, further comprising:

detecting, with a spectrometer, a reflection spectrum of the reflection light reflected from the first substrate; and correcting the position of the first alignment mark based on a detection result of the spectrometer.

11. The bonding method of claim 8, wherein the second imaging unit has a color camera, and the color camera includes a first color light-receiving element and a second color light-receiving element configured to receive light of different colors, and the bonding method further comprises correcting the position of the first alignment mark based on a ratio of received light intensities of the first color light-receiving element and the second color light-receiving element constituting a single pixel.

12. The bonding method of claim 8, wherein the second radiation unit radiates the white light, first color light, and second color light having different colors to the imaging area of the second imaging unit while switching the first color light and the second color light, the second imaging unit has a black-and-white camera, and the black-and-white camera includes a light-receiving element, and the bonding method further comprises correcting the position of the first alignment mark based on a ratio of received light intensities of the same light-receiving element when the first color light and the second color light are radiated while being switched in a state that the imaging area of the second imaging unit is fixed.

13. The bonding method of claim 12, wherein the second radiation unit has a first color filter configured to selectively transmit the first color light among the white light, and a second color filter configured to selectively transmit the second color light among the white light.

14. The bonding method of claim 12, wherein the second radiation unit has a light source for the white light, and the light source for the white light has a light source for the first color light and a light source for the second color light, or the second radiation unit has a light source for the white light, a light source for the first color light, and a light source for the second color light, separately.

* * * * *